United States Patent [19]

Harada

[11] Patent Number: 4,902,908
[45] Date of Patent: Feb. 20, 1990

[54] SUPERCONDUCTING CIRCUIT

[75] Inventor: Yutaka Harada, Tokyo, Japan

[73] Assignee: Research Development Corporation of Japan, Tokyo, Japan; a part interest

[21] Appl. No.: 146,160

[22] Filed: Jan. 20, 1988

[30] Foreign Application Priority Data

| Jan. 20, 1987 | [JP] | Japan | 62-11085 |
| Feb. 4, 1987 | [JP] | Japan | 62-24356 |
| Mar. 9, 1987 | [JP] | Japan | 62-53416 |

[51] Int. Cl.$^4$ .............. H03K 5/24; H03K 17/92; H03K 19/195
[52] U.S. Cl. .................. 307/245; 307/277; 307/476; 307/355; 505/858; 505/861; 505/864
[58] Field of Search ............ 307/245, 277, 306, 355, 307/476; 357/5

[56] References Cited

U.S. PATENT DOCUMENTS

| 3,696,287 | 10/1972 | Silver et al. | 307/306 |
| 4,274,015 | 6/1981 | Faris | 307/306 |
| 4,713,562 | 12/1987 | Hasuo et al. | 307/306 |

OTHER PUBLICATIONS

"Superconducting A/D Converter Using Latching Comparators", by C. A. Hamilton, et al., IEEE Trans. Magnetics, vol. MAG-21, No. 2, Mar. 1985, pp. 197-199.

"A High-Speed Analog-to-Digital Converter Using Josephson Self-Gating-AND Comparators", by D. A. Petersen et al., IEEE Trans. Magnetics, vol. MAG-21, No. 2, Mar. 1985, pp. 200-203.

"Analysis of Flux Input and Output Josephson Pair Device", by K. Loe, et al., IEEE Trans. Magnetics, vol. MAG-21, No. 2, pp. 884-887, Mar. 1985.

Primary Examiner—John Zazworsky
Attorney, Agent, or Firm—Fleit, Jacobson, Cohn, Price Holman & Stern

[57] ABSTRACT

A superconducting circuit comprises a quantum flux parametron. In the superconducting circuit, at least one of two Josephson devices is a voltage controlled superconducting device, the critical current of which can be controlled by applying a voltage. By adjusting the applied voltage, the critical currents of the two Josephson devices can be equalized. If an input signal is used as the applied voltage, the input signal can be isolated from an output signal. And further, if both critical currents of the two Josephson devices are increased after an input signal is supplied, the input signal can be stably amplified.

7 Claims, 10 Drawing Sheets

SUPERCONDUCTING CIRCUIT

FIELD OF THE INVENTION

This invention relates to superconducting circuits, which operate under very low temperature. More particularly this invention relates to superconducting circuit comprising the quantum flux parametron.

DESCRIPTION OF THE PRIOR ART

QFP, which is the abbreviation of the Quantum Flux Parametron, is a parametron-type superconducting switching circuit. In QFP, a dc magnetic flux quantum is used as a signal medium and the operation is based on a new concept. QFP is extremely adequate for computer elements because QFP operates in a very high speed, consuming less power. QFP also has very good qualities as an analog circuit such as a magnetic flux sensor because QFP can amplify very weak magnetic flux in a high gain.

The original construction of QFP is shown in FIG. 2. QFP has a superconducting loop 5 comprising a pair of circuits, each of which has a first Josephson device 1 or a second Josephson device 2 and a first exciting inductor 3 or a second exciting inductor 4. An input line 7 and a load inductor 8 are directly connected to the superconducting loop 5 between the first and second exciting inductors 3 and 4. An exciting line 6 is disposed adjacent to that superconducting loop 5, and this exciting line 6 is magnetically coupled with the exciting inductors 3 and 4. An exciting current source 9 supplies an exciting current to the exciting line 6. Next, the operation of QFP will be described.

During the excited state in which the exciting current is supplied, a current flows from the superconducting loop 5 to the ground or in the opposite direction to this, having the same absolute value in each case. The direction of the current corresponds to "0" or "1" in the digital signals. Usually, the direction from QFP to the ground corresponds to "1" and the opposite direction corresponds to "0". Without supplying the exciting current to the exciting line 6, an input current (input magnetic flux) is directly injected to the superconducting loop 5 through the input line 7. Next, the exiting current is supplied, then an amplified output current flows through the load inductor 8. The direction of the output current depends on the direction of the input current. QFP may bring a very high gain because QFP can amplify a very weak signal to a very large signal.

As described above, QFP comprises a pair of circuits, each of which has one Josephson device and one inductor. In order to bring out the potential of QFP, the pair of circuits should have the same characteristics. If the characteristics do not match, a high gain can not be obtained and faults may occur. In a typical structure of Josephson devices, a very thin insulator film of a few tens angstrom is placed between two superconducting films, so that it is difficult to equalize the characteristics of Josephson devices. Even if Josephson devices are produced under the same process condition, critical currents (maximum superconducting currents) of Josephson devices largely vary. Therefore, in order to produce QFP of the original construction, a process margin should be narrow and production process should be strictly controlled. However, even though such strictly controlled production process is adopted, many defects are produced.

The original QFP has another problem that input signals are not isolated from output signals because QFP is a two terminal network and an input terminal can not be isolated from an output terminal. Therefore, the input signals may be influenced by the amplified output signals and further the influence may be transmitted to subsequent circuits. In order to eliminate the influence, a complicated circuit construction such as a three or more poly-phase ac power drive method should be adopted.

An object of this invention is to provide a super conducting circuit comprising QFP, which enables a wide margin to be used, whereby a high yield of functionally uniform circuits and large scale integration are made possible.

Another object of this invention is to provide a super conducting circuit comprising QFP, which enables input signals to be isolated from output signals, thereby permitting systems to be represented by a simple circuit construction.

According to one aspect of this invention, there is provided a superconducting circuit in which at least one of Josephson devices of QFP is a voltage controlled super-conducting device, the critical current of which can be controlled.

When voltage is applied to the voltage controlled superconducting device through a voltage supply means such as a conducting line, the critical current varies. Therefore, the critical currents of two Josephson devices can be equalized with each other by adjusting the supplied voltage.

When an input signal is applied to the voltage controlled superconducting device, the input signal is completely isolated from the output signal.

BRIEF DESCRIPTION OF THE DRAWINGS

The foregoing and other objects of this invention will be seen by reference to the description, taken in connection with the drawings in which.

DESCRIPTION OF PREFERRED EMBODIMENTS

Figure 1:
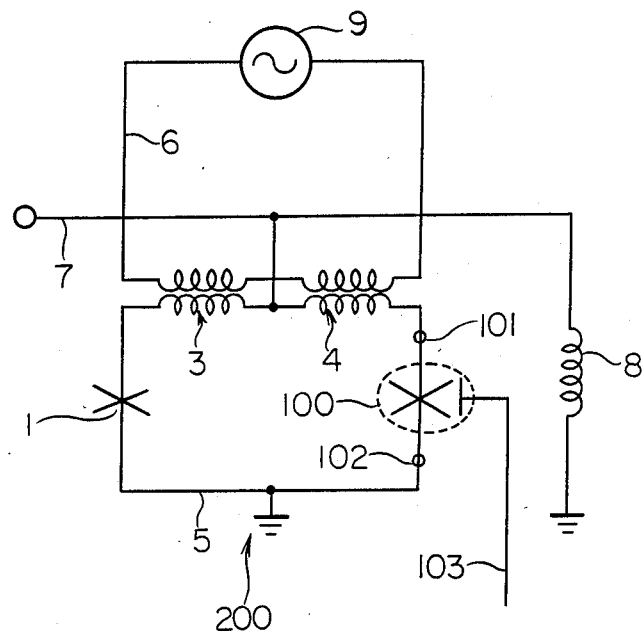
FIG. 1 is a circuit diagram of a first embodiment according to this invention.
Figure 2:
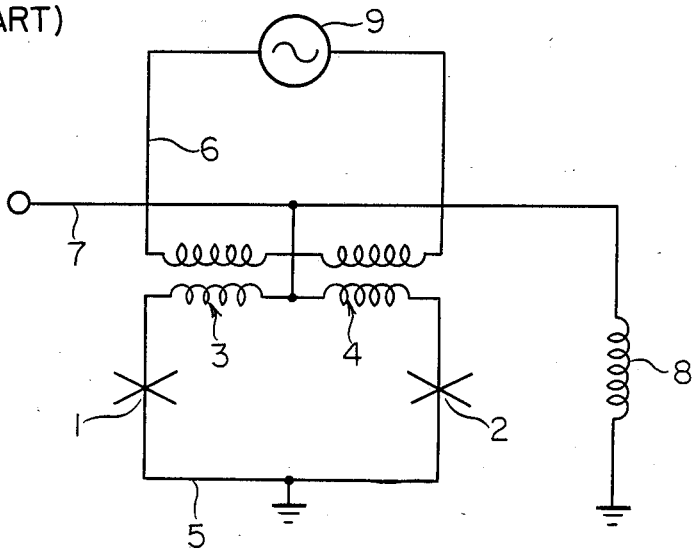
FIG. 2 is a circuit diagram of the original construction of QFP.
Figure 3:
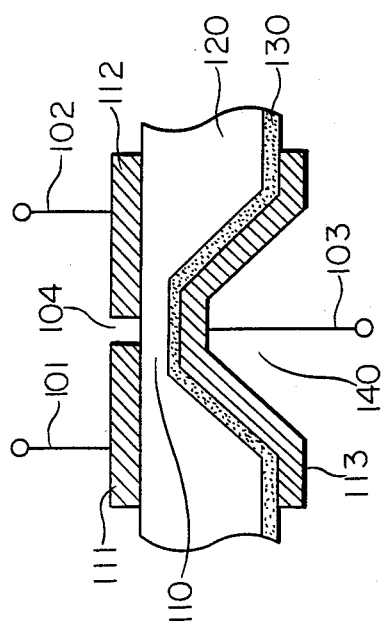
FIG. 3 is a sectional view of a three-terminal superconducting device.

FIG. 1 shows a first embodiment of this invention. In QFP 200 shown in FIG. 1, a voltage controlled superconducting device 100 is adopted as the second Josephson device 2 in FIG. 2. FIG. 3 shows an example of this voltage controlled superconducting device 100. This device is disclosed by Nishino et al. in "Three-Terminal Superconducting Device using a Si Single-Crystal Film", IEEE Electron Device Lett.,vol.EDL-6 No.6 pp. 298–299, June 1985. The construction of the voltage controlled superconducting device is similar to that of an FET and the term of each part is determined according to that of an FET. More specifically, a source electrode 111 and a drain electrode 112, which are made of superconducting metal, contact to a purified surface of p type silicon substrate 120, being separated by a very narrow gap, e.g. $0.2\mu m$. A hole 140 is bored from the back surface of the silicon substrate so that a p type silicon thin layer 110 is left on the front surface. A gate electrode 113 is disposed on the silicon layer 110 through a silicon oxide layer 130 against the gap 104. Voltages are applied to the source electrode 111, drain electrode 112 and gate electrode 113 through a source line 101, a drain line 102 and a gate line 103, respectively so that a current flows through between the source electrode 111 and the drain electrode 112. In this three terminal superconducting device 100, an electric field generated by the voltage of the gate electrode 113 controls the critical current flowing through the silicon (semiconductor) substrate 120 by the medium of superconducting electron pairs which are penetrated from the source electrode 111 and the drain electrode 112 to the p type silicon inner surface. In the case shown in FIG. 3, since the silicon substrate is p type, the critical current decreases as the gate voltage rises. In the case that n type silicon substrate is used, the same characteristic of the critical current is obtainable by inverting the gate voltage. When the three terminal superconducting device shown in FIG. 3 is adopted as the second Josephson device 2 of QFP shown in FIG. 2 and the voltage, which is applied to the voltage controlled superconducting device, is varied through the gate line 103 as voltage supply means, the critical current flowing through between the source and the drain can be adjusted to the critical current of the first Josephson device. Therefore, the difference between critical currents of two Josephson devices of QFP can be eliminated. It should be noted that any kind of the voltage controlled superconducting devices can be adopted so far as the critical current can be controlled by applying a voltage to the device and varying the voltage.

Figure 4:
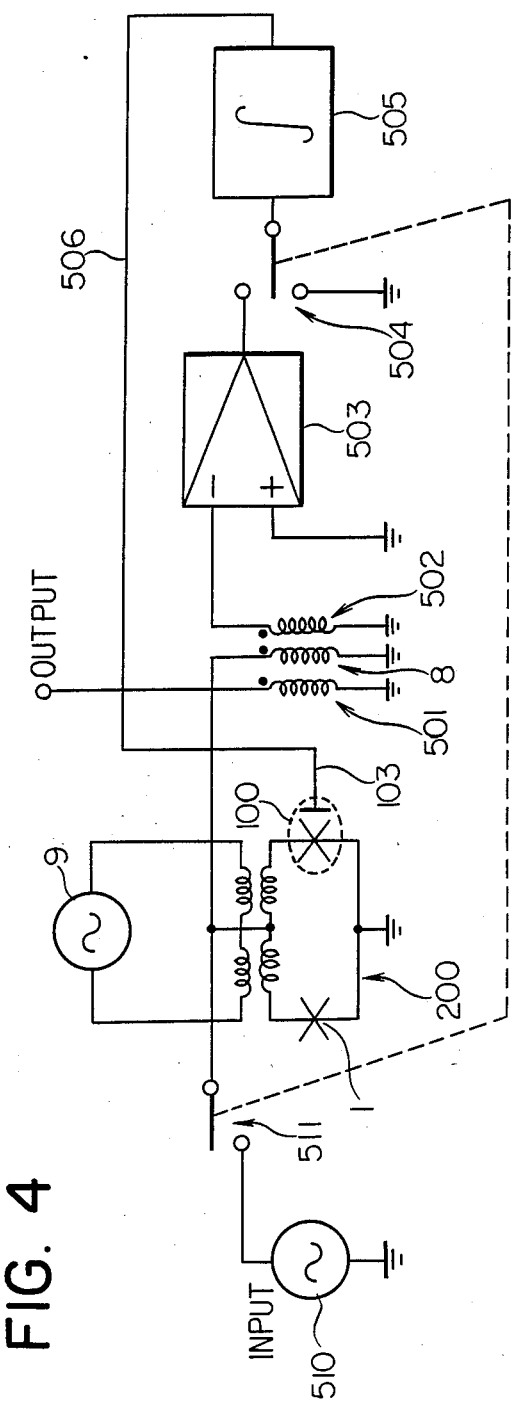
FIG. 4 is a circuit diagram of a second embodiment according to this invention.

FIG. 4 shows a circuit diagram of a second embodiment according to this invention. In this embodiment, the same QFP as shown in FIG. 1 is used. An output signal (output current) flowing through the load inductor 8 of QFP is transmitted to an inverting amplifier 503 through a transformer 502. The signal is inverted and amplified in the amplifier 503 and then transferred to an integrator 505 through a switch 504. The output signal integrated in the integrator 505 is applied to the gate electrode of the voltage controlled superconducting device 100 through a feedback line 506 and a gate line 103. As a result, a feedback circuit from the load inductor 8 to QFP 200 is constructed. The voltage controlled superconducting device 100 has the p type characteristics. QFP 200 is excited by an exciting current source 9. An input signal of a signal generator 510 inputs to QFP through a switch 511, an output signal outputs from QFP through the transformer 501 which is magnetically coupled with the load inductor 8. The switches 504 and 511 are interlocked with each other. In the case of zero point adjustment to match the critical currents of the pair of Josephson devices, the switch 511 is opened not to introduce the input signal to the circuit and the switch 504 is actuated to connect the amplifier 503 to the integrator 505. In the case of measurement of a signal from the signal source, the switch 511 is actuated to connect the signal source 510 to QFP 200, and the switch 504 connects an input terminal of the integrator 505 to the ground. When the input terminal of the integrator 505 is grounded, value of an output signal from the integrator 505 is maintained because no signal is supplied to the integrator 505. The maintained signal is applied to the voltage controlled superconducting device 100 through the feedback line 506. Operation of this embodiment will be described. If the critical current of the voltage controlled superconducting device 100 is smaller than the critical current of the Josephson device 1, current flows through the load inductor 8 in the positive direction, that is, from QFP to the ground. The current signal is amplified by the inverting amplifier 503 through a transformer 502. Therefore, the polarity of the amplified signal becomes negative and is subtracted from the integrated value of the integrator 505. As a result, the controlling voltage of the voltage controlled superconducting device 100 decreases and the critical current increases. If the critical current of the voltage controlled superconducting device 100 is larger than the critical current of the Josephson device 1, the voltage, which is supplied to the voltage controlled superconducting device 100 through the negative feedback, increases and the critical current decreases. In sum, the embodiment shown in FIG. 4 has the feedback circuit which serves to make the critical current of the voltage controlled superconducting device 100 equal to the critical current of the Josephson device 1, that is, this has a faculty of a zero adjustment which is extremely effective to obtain a highly accurate measurement apparatus.

Figure 5:
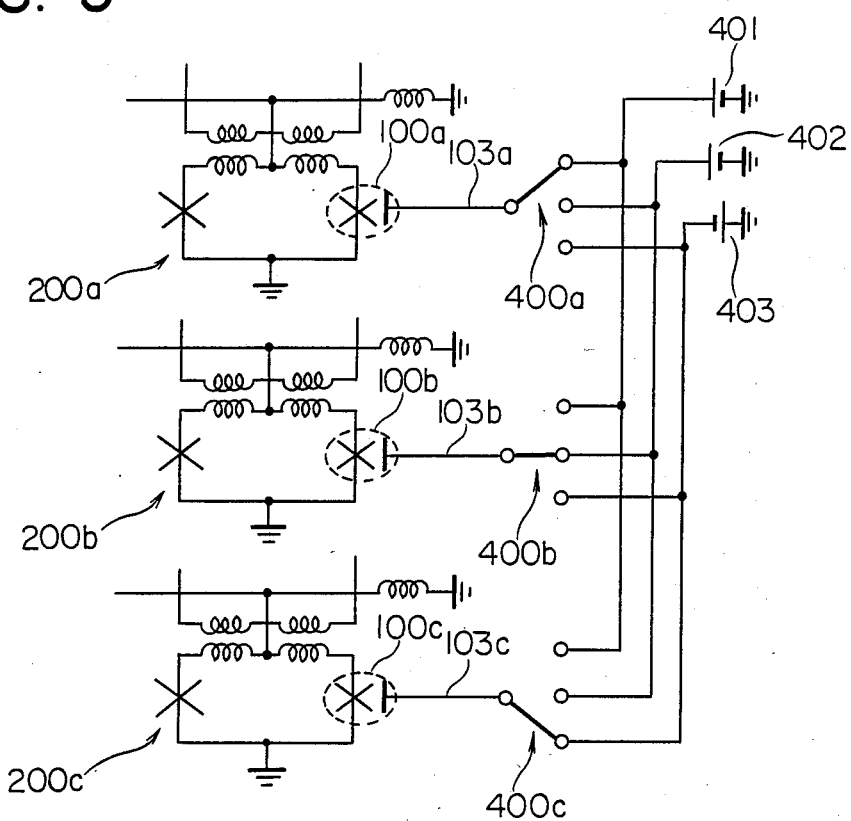
FIG. 5 is a circuit diagram of a third embodiment according to this invention.

FIG. 5 is a circuit diagram of a third embodiment of this invention. This embodiment is effective in establishing a system including a plurality of QFPs. As shown in FIG. 5, QFPs 200a, 200b and 200c comprise the three terminal superconducting devices 100a, 100b and 100c, respectively. Gate voltages of the devices are supplied by voltage sources 401, 402 and 403 through gate lines 103a, 103b and 103c and selectors 400a, 400b and 400c, respectively. The voltages of a plurality of voltage sources 401, 402 and 403 are selected, for example, as a positive, the ground and a negative potentials, respectively. The potential to be supplied to each QFP is selected by the corresponding selector 400a, 400b, 400c. This voltage selection is carried out after a superconducting circuit comprising QFP is manufactured and the characteristic of each device is tested. The voltage selectors 400a, 400b, 400c may be realized by switches or lines to be trimmed in an integrated circuit. If many distinct voltage sources are prepared, the critical current is precisely adjusted. The number of the sources depends on the faculty of the system. In digital systems, only a few sources are required.

Figure 6:
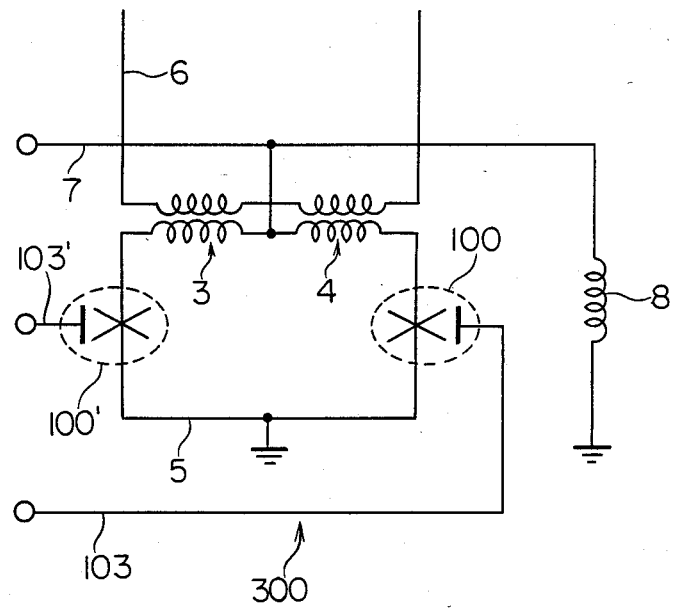
FIG. 6 is a circuit diagram of a fourth embodiment according to this invention.

FIG. 6 shows a fourth embodiment of this invention. In QFP 300 of this embodiment, both of the first and second Josephson devices 1 and 2 of QFP shown in FIG. 2 are the voltage controlled superconducting devices 100 and 100'. Voltages are supplied to the voltage controlled superconducting devices through lines 103 and 103' to match the critical currents. This fourth embodiment is applicable in the embodiments shown in FIGS. 4 and 5.

In the embodiment shown in FIG. 4, instead of the transformer, SQUID (Superconducting Quantum Interference Device) may be used to detect signals from QFP.

According to the embodiments, QFP is constructed by a pair of Josephson devices which have the same characteristic, so that high gain switching circuits are obtained and false operations are eliminated. Therefore, highly precise measurement apparatus such as a magnetic sensor become obtainable. Since the characteristics cf the Josephson devices are matched after fabrication, it becomes possible to realize highly integrated switching circuits and large size super high speed computers.

Figure 7:
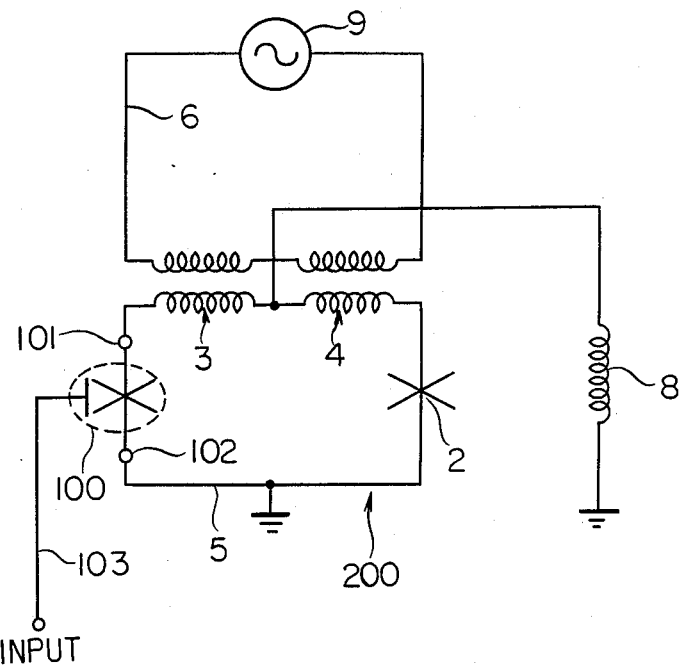
FIG. 7 is a circuit diagram of a fifth embodiment according to this invention.

FIG. 7 shows a fifth embodiment of this invention. As shown in FIG. 7, the voltage controlled superconducting device 100 is adopted as one of Josephson devices comprising QFP and an input signal voltage is supplied to the voltage controlled superconducting device 100 through line 103 as an input signal supply means. An output signal appears on the load inductor 8, depending on whether the critical current of the second Josephson device 2 is larger than the critical current of the voltage controlled superconducting device 100.

Figure 8:
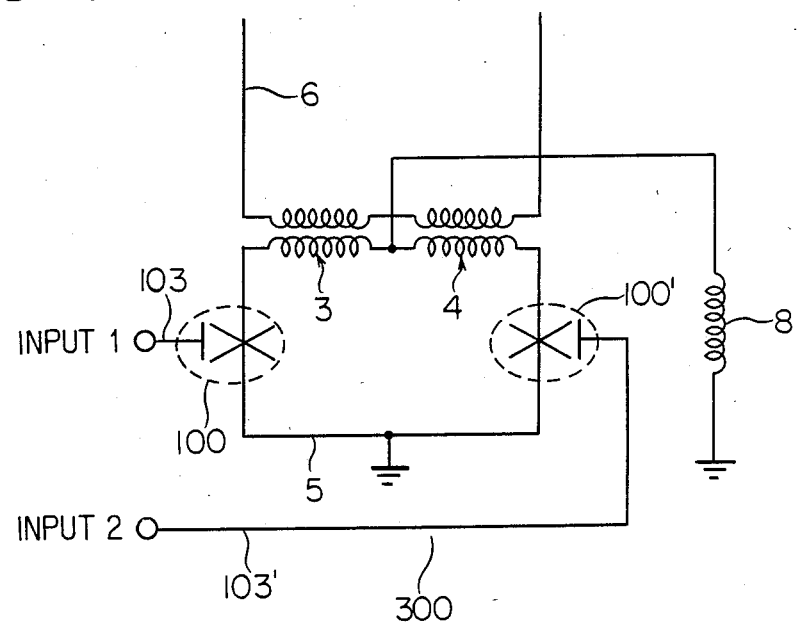
FIG. 8 is a circuit diagram of a sixth embodiment according to this invention.

FIG. 8 shows a sixth embodiment of this invention. In this embodiment, both of the first and second Josephson devices 1 and 2 in FIG. 2 are the voltage controlled superconducting devices 100 and 100'. If a first input signal INPUT 1 is applied to the line 103 of the voltage controlled superconducting device 100 and a second input signal INPUT 2 is applied to the line 103' of the voltage controlled superconducting device 100', this circuit serves as a comparator comparing the first signal voltage and the second signal voltage. In this embodiment, the input signal is also isolated from the output signal appearing on the load inductor 8.

Figure 9:
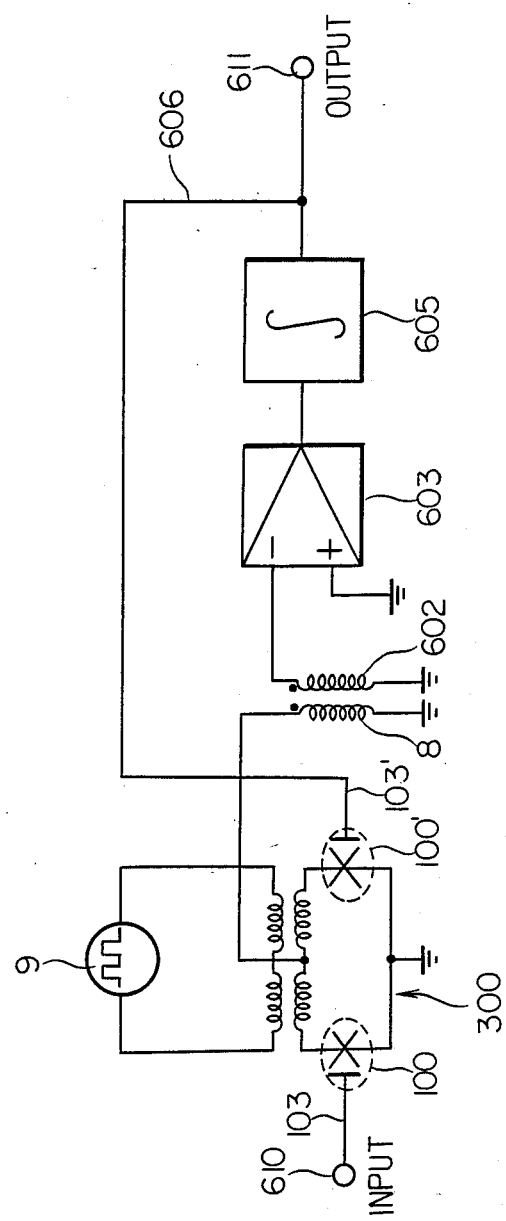
FIG. 9 is a circuit diagram of a seventh embodiment according to this invention.

FIG. 9 shows a seventh embodiment of this invention and illustrates an example of amplifiers. In this embodiment, QFP 300 is used as a voltage comparator. An output signal from QFP is fed back to a control terminal 133' of the voltage controlled superconducting device 100' through a transformer 602, an amplifier 603, an integrator 605 and a feedback loop 606. In this construction, the feedback signal varies with an input signal INPUT which is supplied to the voltage controlled superconducting device 100 through a terminal 610. The feedback signal also outputs from an output terminal 611 as an output signal OUTPUT. In the embodiment shown in FIG. 9, the output signal voltage becomes the input signal voltage. However, if the output signal voltage from the integrator 605 is divided by A and supplied to the voltage controlled superconducting device 100', the output signal from the output terminal 611 becomes A times as large as the input signal. This embodiment brings great effects under such circumstances that ordinary semiconductor amplifiers can not be used due to a very low temperature.

The signal from QFP may be also detected by other means such as SQUID (Superconducting Quantum Interference Device), instead of the transformer.

According to the embodiments shown in FIGS. 7 to 9, there are provided superconducting circuits in which the input signal line is isolated from the output line. Therefore, systems can be constructed with simple circuit structures and super high speed computer can be provided.

As described above, when QFP is excited, QFP causes transition to either of two stable states, depending on the polarity of the input signal. However, transition probabilities depend on intensity of the input signal. If the input signal is too small, the transition probabilities to the two stable states both become about 50% and false operations may occur.

Figure 10:
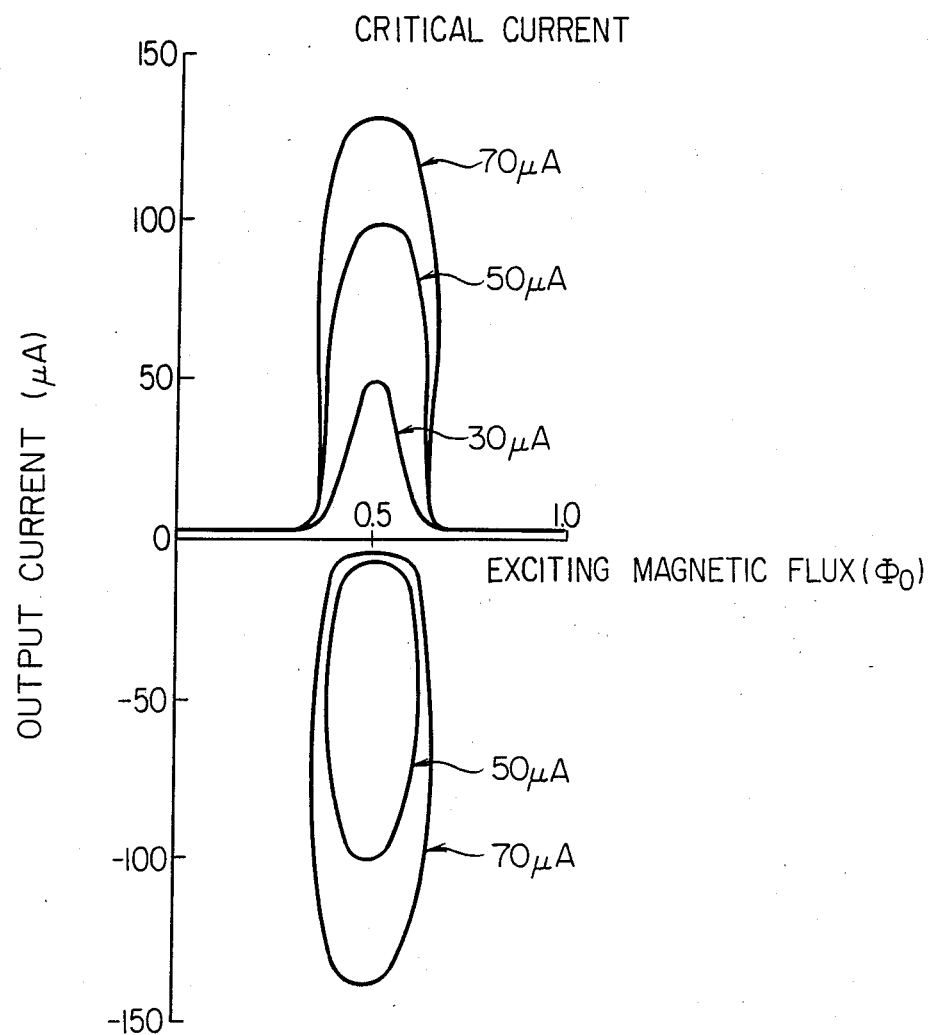
FIG. 10 is a graph showing relations between output signals and exciting currents for distinct critical currents.

As a result of analyzation of QFP, operation characteristics were obtained as shown in FIG. 10. FIG. 10 is a graph showing output signals of QFP with Josephson devices of different critical currents as a function of exciting currents, which is represented by exciting magnetic flux with the magnetic flux quantum $\Phi_o(2.07\times 10^{-15}\text{wb})$ as the unity. In this case, an input signal is 0.02 times as large as the magnetic flux quantum. The non-excited state corresponds to zero exciting current, the excited state corresponds to $0.5\Phi_o$ of exciting magnetic flux. Therefore, the input signal is injected while the exciting current is zero, and then the exciting flux (current) is supplied to $0.5\Phi_o$. In the exciting state, there are shown two kinds of states, that is, states of positive and negative output currents. Each state corresponds to either of the above two stable states. In FIG. 10, the input signal is positive, so that the output signal current should flow in the positive direction. This normal operation corresponds to the continuous curves, rising as the exciting current increases. However, the output current may transit to the isolated negative region. In the normal operation, when the excitation is caused, the output current increases along the continuous lines. However, the output signal may transit to the negative current region due to resonances of circuits or internal noises. The nearer the distance between the positive region and the negative region is, the higher the probability of the fail operations is. FIG. 10 shows the output signals in the case that the critical currents of Josephson devices are 30μA, 50μA and 70μA. From FIG. 10, it is found that the smaller the critical current is, the smaller the probability of the false operations is. Especially, when the critical current is 30μA, the negative current region disappears and the fail operations never happen. Therefore, if a small input signal is stably amplified while the critical current is relatively small and the amplified signal is further amplified by increasing the critical current, the input signal is stably amplified to a required level.

Figure 11:
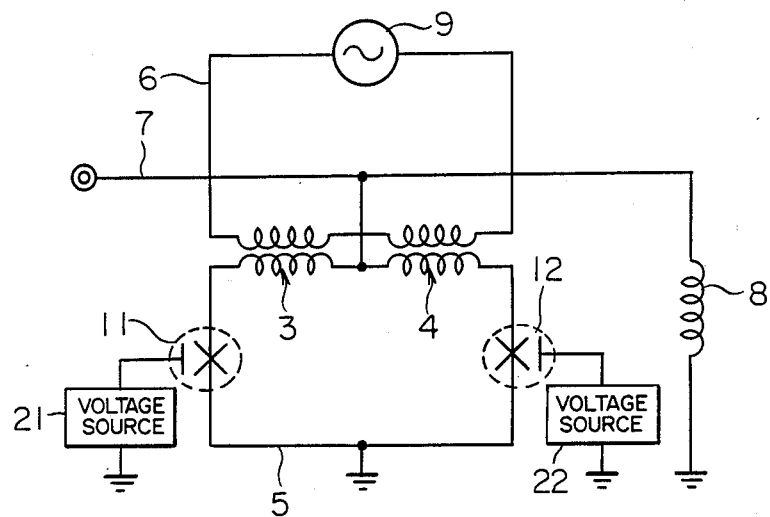
FIG. 11 is a circuit diagram of an eighth embodiment according to this invention.
Figure 12:
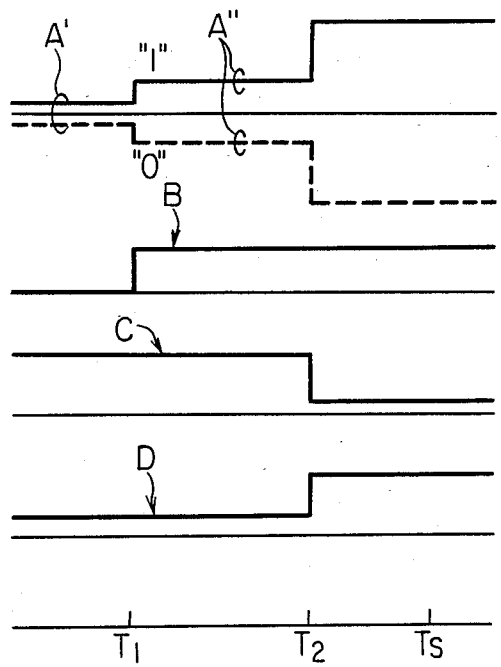
FIG. 12 is a timing chart, illustrating the operation of the eighth embodiment according to this invention.

FIG. 11 shows an eighth embodiment of this invention and FIG. 12 shows a time chart of the eighth embodiment. In the eighth embodiment, the Josephson devices 1 and 2 shown in FIG. 2 are replaced with the voltage controlled superconducting devices 11 and 12 shown in FIG. 3. Gate voltages of the superconducting devices 11 and 12 are supplied by voltage sources 21 and 22. Prior to supply of an exciting current, a very small input signal A' is input at which the gate voltages C of the superconducting devices 11 and 12 are set to a high level, and the critical currents D of the devices 11 and 12 are small. In this condition, at time $T_1$, an output signal A" appears when an exciting signal B is supplied. The output signal is small because the critical currents of the three terminal superconducting devices 11 and 12 are small. At time $T_2$, the gate voltages generated by the voltage sources 21 and 22 are reduced and the critical current values of the devices are increased, so that the output current flowing through the lead inductor 8 is amplified. The amplified output is detected at time $T_s$.

Figure 13:
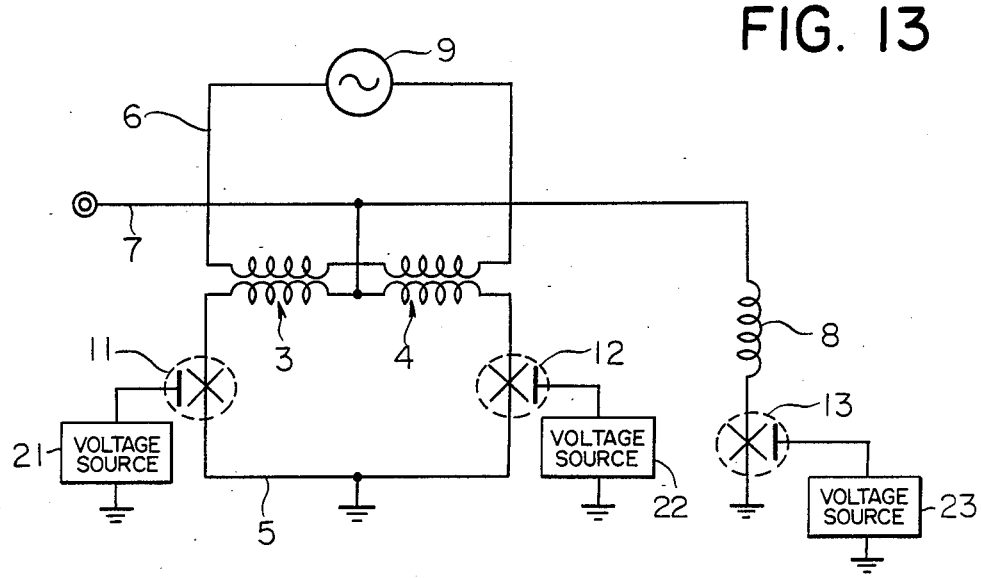
FIG. 13 is a circuit diagram of a ninth embodiment according to this invention.
Figure 14:
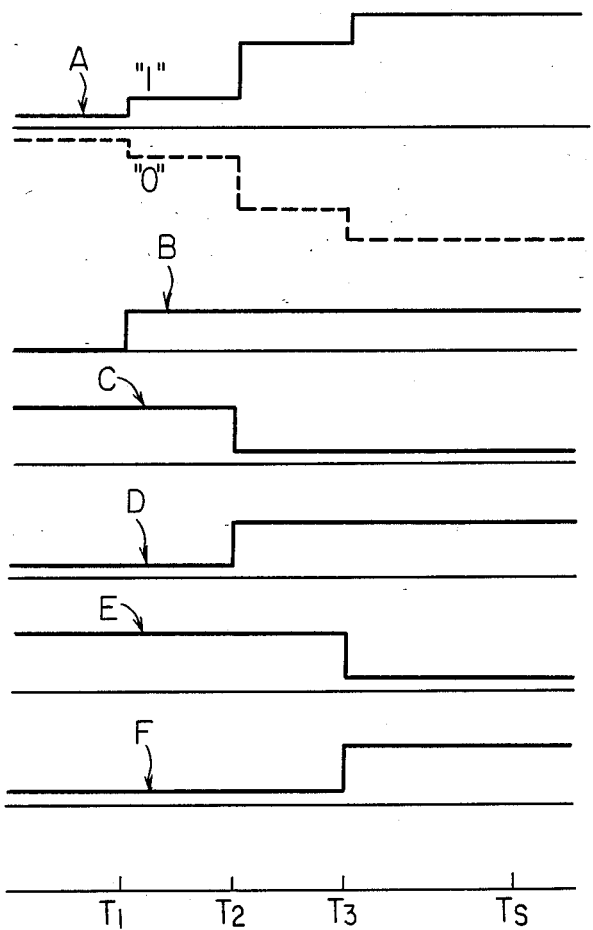
FIG. 14 is a timing chart, illustrating the operation of the ninth embodiment according to this invention.

FIG. 13 shows a ninth embodiment of this invention and FIG. 14 shows a time chart of the ninth embodiment. Generally, the optimum load inductance of QFP varies with the critical current values. If the load inductance is not the optimum value, a large output is not obtained. In this embodiment, a third voltage controlled superconducting device 13 is connected to the load inductor 8 in the eighth embodiment shown in FIG. 11. The gate voltage of the third voltage controlled superconducting device 13 is supplied by a third voltage source 23. Since the third voltage controlled superconducting device 13 acts as a non-linear inductor, the inductance of the superconducting device 13 can be selected by varying the critical current. In this embodiment, an input signal is amplified as in the embodiment illustrated in FIGS. 11 and 12. At time $T_3$, the gate voltage E is reduced and the critical current F of the device 13 is increased. As a result, an equivalent inductance of the third voltage controlled superconducting device 13 is reduced to optimize the load condition. If the optimum load condition is selected, the output current A is further increased as shown in FIG. 14. The amplified output signal A is taken out at time $T_s$. According to this embodiment, a much larger output is obtained.

Figure 15:
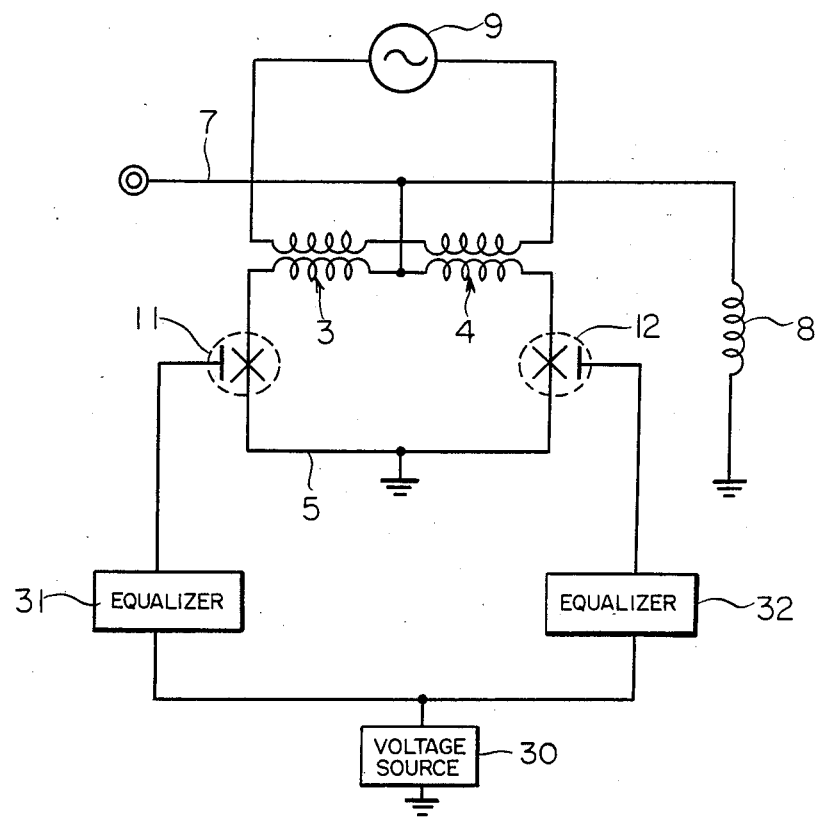
FIG. 15 is a circuit diagram of a tenth embodiment according to this invention.
Figure 16:
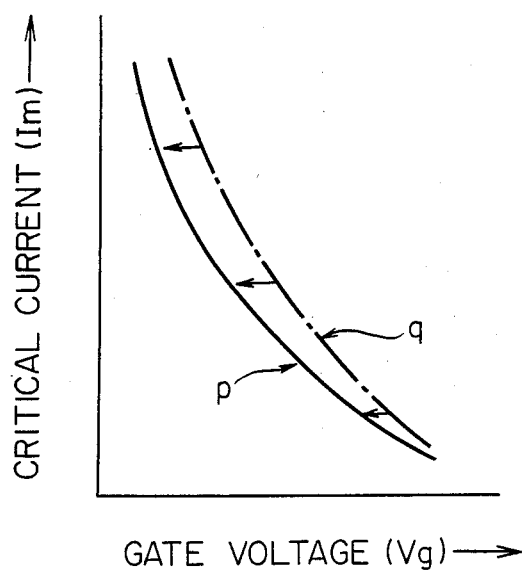
FIGS. 16 and 17 are graphs, illustrating methods of adjusting critical currents of Josephson devices in the tenth embodiment shown in FIG. 15.

FIG. 15 shows a tenth embodiment of this invention. As described above, the critical currents of the two Josephson devices in QFP should be equalized in order to obtain a high gain. In this example, the critical currents of the two voltage controlled superconducting devices 11 and 12 are varied, being kept equalized. A gate of the first voltage controlled superconducting device 11 is supplied with an output signal of the control voltage source 30 through equalizer 31, and a gate of the second voltage controlled superconducting device 12 is supplied with an output signal of the control voltage source 30 through equalizer 32. The equalizers 31 and 32 are the means for correcting the difference between the critical currents of the two voltage controlled superconducting devices 11 and 12 and basically constructed from resistance networks. By means of the equalizers 31 and 32, the gate voltages applied to the two voltage controlled superconducting devices 11 and 12 are adjusted. If the curves p and q representing dependencies of the critical currents $I_m$ upon the gate voltages Vg of the two voltage controlled superconducting devices do not coincide as shown in FIG. 16, the voltages, being applied to the gates, can be so adjusted that the critical currents are equalized. More specifically, the voltage to be applied to the device having the characteristic of q is attenuated by the attenuator constructed from a resistance network so that the characteristic of q moves to that of p as shown by arrows in FIG. 16. Consequently, the critical currents are equalized.

Figure 17:
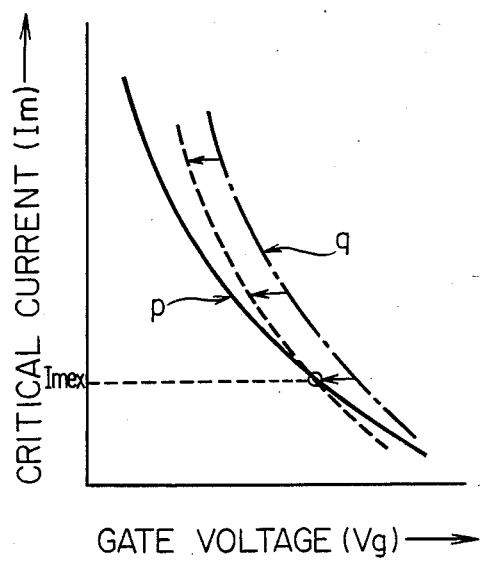

When the characteristics of the two devices can not be equalized even if the gate voltage is attenuated, the amount of attenuation by the equalizers 31 and 32 may be adjusted so as to equalize only lower critical currents $I_{mex}$ at the beginning of the excitement of QFP as shown in FIG. 17. In this way, the most unstable condition at the beginning of the excitement can be improved.

As described above, according to the embodiments shown in FIGS. 11, 13 and 15, stable, high gain and high speed amplifiers can be provided using a small number of QFP. Therefore, high speed and highly accurate measurement apparatus such as a magnetic sensor can be realized.

As this invention may be in several forms without departing from the spirit if essential characteristics thereof, the above embodiments are therefore illustrative and not restrictive, since the scope of the invention is defined by the appended claims rather than by the description proceeding them, and all changes that fall within meets and sounds of the claims, or equivalence of such meets and bound are therefore intended to be embraced by the claims.

What is claimed is:

1. A superconducting circuit comprising a quantum flux parametron which comprises a superconducting loop and a load inductor connected thereto, said superconducting loop including two Josephson devices through which critical currents are respectively conducted and two exciting inductors, at least one of said Josephson devices being a voltage controlled superconducting device, the critical current of which is controllable by an applied voltage, and voltage supply means supplying the applied voltage to the voltage controlled superconducting device for equalizing the critical currents of the two Josephson devices wherein the voltage supply means comprises integrator means for integrating a signal from the load inductor to produce an output signal, and means for supplying said output signal from the integrator means to the voltage controlled superconducting device.

2. A superconducting circuit comprising a quantum flux parametron which comprises a superconducting loop and a load inductor connected thereto, said superconducting loop including two Josephson devices through which critical currents are respectively conducted and two exciting inductors, at least one of said Josephson devices being a voltage controlled superconducting device, the critical current of which is controllable by an applied voltage, and voltage supply means supplying the applied voltage to the voltage controlled superconducting device for equalizing the critical currents of the two Josephson devices wherein the voltage supply means comprises a plurality of distinct voltage sources and means for selecting one of the sources from which the applied voltage is supplied.

3. A superconducting circuit comprising a quantum flux parametron which comprises a superconducting loop and a load inductor connected thereto, said superconducting loop including two Josephson devices through which critical currents are respectively conducted and two exciting inductors, a first of said Josephson devices being a voltage controlled superconducting device, the critical current of which is controllable by an applied voltage, and means for supplying an input signal as the applied voltage to the voltage controlled superconducting device wherein the other of the Josephson devices is a voltage controlled superconducting device to which another input signal is supplied whereby an output signal appearing on the load inductor depends on a voltage difference between the input signals respectively supplied to the superconducting devices.

4. A superconducting circuit comprising a quantum flux parametron which comprises a superconducting loop and a load inductor connected thereto, said superconducting loop including two Josephson devices through which critical currents are respectively conducted and two exciting inductors, a first of said Josephson devices being a voltage controlled superconducting device, the critical current of which is controllable by an applied voltage, and means for supplying an input signal as the applied voltage to the voltage controlled superconducting device wherein a second of the Josephson devices is a superconducting device to which an input signal is supplied and means integrating a signal from the load inductor as the applied voltage supplied to the first superconducting device.

5. In combination with a quantum flux parametron which comprises a superconducting loop and an inductor connected thereto, the superconducting loop including two exciting inductors and first and second voltage controlled superconducting devices, an excitation system comprising means for increasing critical currents of both of the voltage controlled superconducting devices including means for varying the inductance of said load inductor in accordance with the critical currents of the superconducting devices.

6. The system set forth in claim 5, in which the load inductor comprises a third three terminal superconducting device to which a gate voltage is applied and means for changing the gate voltage of the third three terminal superconducting device to vary the inductance thereof.

7. The system set forth in claim 5, including means controlling the voltages applied to the first and second superconducting devices for equalizing the critical currents thereof.

* * * * *